United States Patent [19]

Busta

[11] Patent Number: 4,859,623
[45] Date of Patent: Aug. 22, 1989

[54] METHOD OF FORMING VERTICAL GATE THIN FILM TRANSISTORS IN LIQUID CRYSTAL ARRAY

[75] Inventor: Heinz H. Busta, Park Ridge, Ill.

[73] Assignee: Amoco Corporation, Chicago, Ill.

[21] Appl. No.: 152,349

[22] Filed: Feb. 4, 1988

[51] Int. Cl.$^4$ ...................... H01L 27/02; H01L 29/78
[52] U.S. Cl. ......................................... 437/48; 437/59;
357/40; 357/23.4; 357/41; 357/23.7
[58] Field of Search ....................... 357/40, 23.4, 23.7;
437/48, 59

[56] References Cited

U.S. PATENT DOCUMENTS

| | | | |
|---|---|---|---|
| 3,863,332 | 2/1975 | Leupp et al. | 437/187 |
| 4,009,061 | 2/1977 | Simon | 156/635 |
| 4,320,190 | 3/1982 | Ruedin | 156/654 |
| 4,332,075 | 6/1982 | Ota et al. | 437/51 |
| 4,470,060 | 9/1984 | Yamazaki | 357/23.7 |
| 4,547,789 | 10/1985 | Cannella et al. | 357/23.4 |

OTHER PUBLICATIONS

VLSI Technology by S. M. Sze, 1983, pp. 356 and 358.
VLSI Technology by S. M. Sze, 1983, p. 305, Fig. 1.

Primary Examiner—Brian E. Hearn
Assistant Examiner—Tuan Nguyen
Attorney, Agent, or Firm—Frank J. Sroka; William H. Magidson; Ralph C. Medhurst

[57] ABSTRACT

Vertical gate thin film transistors are integrated into an actively addressable liquid crystal array to provide the switching function for charging each pixel element and any desired peripheral transistor circuitry. One of the conductive plates of each pixel of the array includes an extended portion. The address lines for the switching/-charging transistors form a grid between the rows and columns of pixels and each intersection of the grid lies on an extended portion of a pixel element with the drain of the associated transistor formed directly on the extended portion. The source of the transistor is that portion of one set of address lines lying superjacent but insulated from the transistor drain. The gate of the transistor is that portion of the second set of address lines which is adjacent but insulated from the edges of the source and drain, lying essentially perpendicular to the substrate. Additional transistors for the peripheral circuitry are formed by the same process steps which form the pixel elements and the switching transistor.

25 Claims, 3 Drawing Sheets

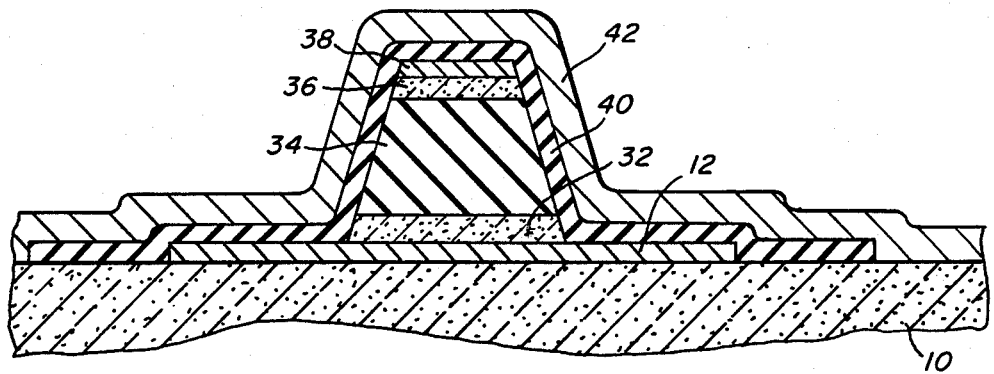
FIG. 2B
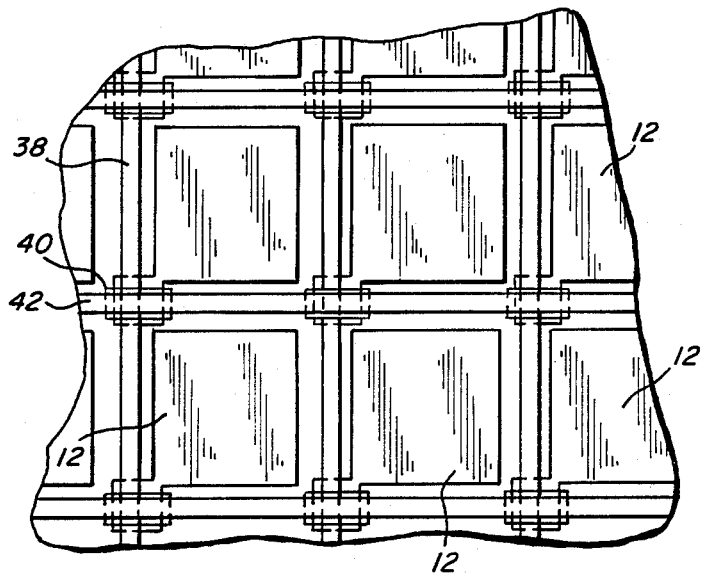
FIG. 3
FIG. 4
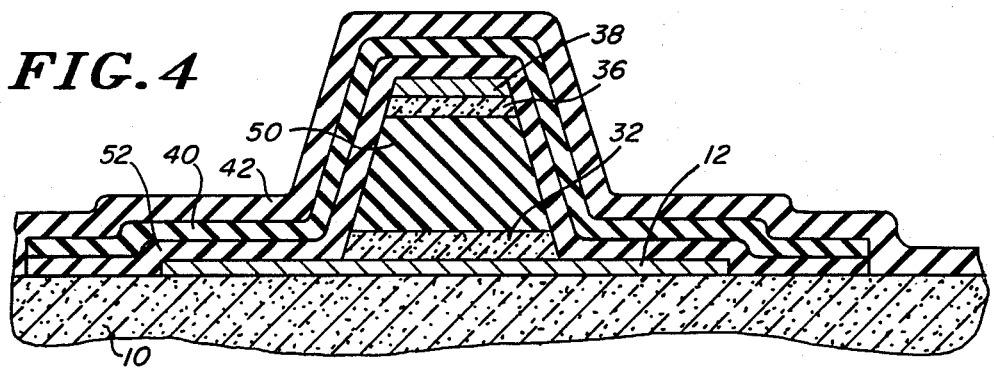

METHOD OF FORMING VERTICAL GATE THIN FILM TRANSISTORS IN LIQUID CRYSTAL ARRAY

BACKGROUND OF THE INVENTION

This invention relates to field effect transistors and, more particularly, to the integration of thin film vertical gate field effect transistors into an actively addressable liquid crystal array.

In the field of flat displays, liquid crystal (LC) arrays have much to recommend them, particularly in that the picture elements or pixels can be very small, one million or more on one substrate, and that pixels and their associated charging transistors can be fabricated on the substrate in one series of known processes. However, these processes are not necessarily without problems due, for example, to the high degree of precision required in the photolithographic processes where an error of a micrometer (micron) or less could make a transistor stay on or off permanently. Since a yield of essentially 100% is required in order to have no apparent defects in the display, such a high requirement for accuracy is not economically feasible.

Most prior art displays have utilized lateral channel thin-film transistors (TFT's) to control the charge which turns on the corresponding liquid crystal element. The usual design has one connection for supplying a voltage to all transistor gates in each row, and a connection for all sources in each column. Thus, by applying the proper voltages to the appropriate row and column, each transistor can be addressed individually for charging the pixel capacitor. This capacitor is usually formed by transparent conductive elements on either side of the liquid crystal material and, when activated by the associated transistor, creates within the pixel the degree of transparency desired. In addition to the problems of the lithography as noted above, lateral devices suffer from an inherent limitation on dynamic performance; i.e. low operation speed (an upper limit of a few hundred kHz).

It will be apparent to those skilled in the art that the required speed of operation increases with the number of pixels in the array. The speed can be improved by increasing the supply voltage and improving the quality of the amorphous silicon material itself, however, the main reason for the limited speed of operation is the length of the channel, typically 5-10 $\mu$m. The minimum length is, as is known, a function of the precision of the photolithography, specifically, the accuracy of the definition of the source and drain. A typical example of this type of array design is found in U.S. Pat. No. 4,621,260, to Suzuki et al. This type of array will be discussed further hereinbelow.

In an attempt to improve the speed of operation of amorphous silicon (a-Si:H) field-effect transistors, a different arrangement of the transistor elements has been developed, as noted in "Proposed Vertical-Type Amorphous Silicon Field-Effect Transistors", by Y. Uchida, Y. Nara and M. Matsumuru, in the IEEE Electron Device Letters, Vol. EDL-5, No. 4, April 1984. In this device, the source is positioned above the drain with the gate on the vertical sidewall. Such transistors are sometimes termed "edge channel" transistors. The channel length can therefore be as small as 1 $\mu$m or even less; i.e. the length is the thickness of a deposited a-Si:H layer. Since an essential part of an LC array is the peripheral circuitry, such as inverters, shift registers, buffer drivers and other logic elements, it would be highly desirable to be able to fabricate all necessary devices in the same series of steps. This would eliminate the need for wire bonding chips, etc. While the use of vertical channel/gate TFTs has been previously suggested for use in liquid crystal arrays, there is no known array structure which takes full advantage of the virtues of such transistors, integrating the switching transistors and peripheral elements into the array in one series of processing steps while also minimizing the required area on the substrate.

SUMMARY OF THE INVENTION

It is, therefore, an object of the present invention to provide a transistor structure for use in an array of display elements.

It is a more particular object to provide a structure which takes maximum advantage of the potentially high operating speed of vertical gate field-effect transistors.

It is another particular object to provide a transistor structure which occupies minimum area on a substrate.

It is still another object to reduce the number of fabrication steps while minimizing the criticality of the steps.

These and other objects which will become apparent are obtained in the structure of the present invention by the utilization of vertical gate TFTs as the control devices in a liquid crystal array such as might be used for a video or data display. The array is addressable by means of a connection between the gates of each transistor in one row of the array and a connection between the sources of each transistor in one column of the array. It will be understood that when the terms "row" and "column" are used in this specification, the terms could be reversed. The gates extend up both sides of the structure, forming two transistors in parallel at each crossover point. The transistor drains provide the necessary charge to the corresponding pixel when the transistors are turned on. The structure is also applicable to the peripheral circuitry of the array with the same series of fabrication steps.

BRIEF DESCRIPTION OF THE DRAWING

FIG. 2B is a cutaway view of the same structure.

FIG. 3 is a plan view of a portion of an array utilizing the invention.

FIGS. 4 is a cutaway view of another embodiment of the invention.

DETAILED DESCRIPTION OF THE PREFERRED EMBODIMENTS

Figure 1:
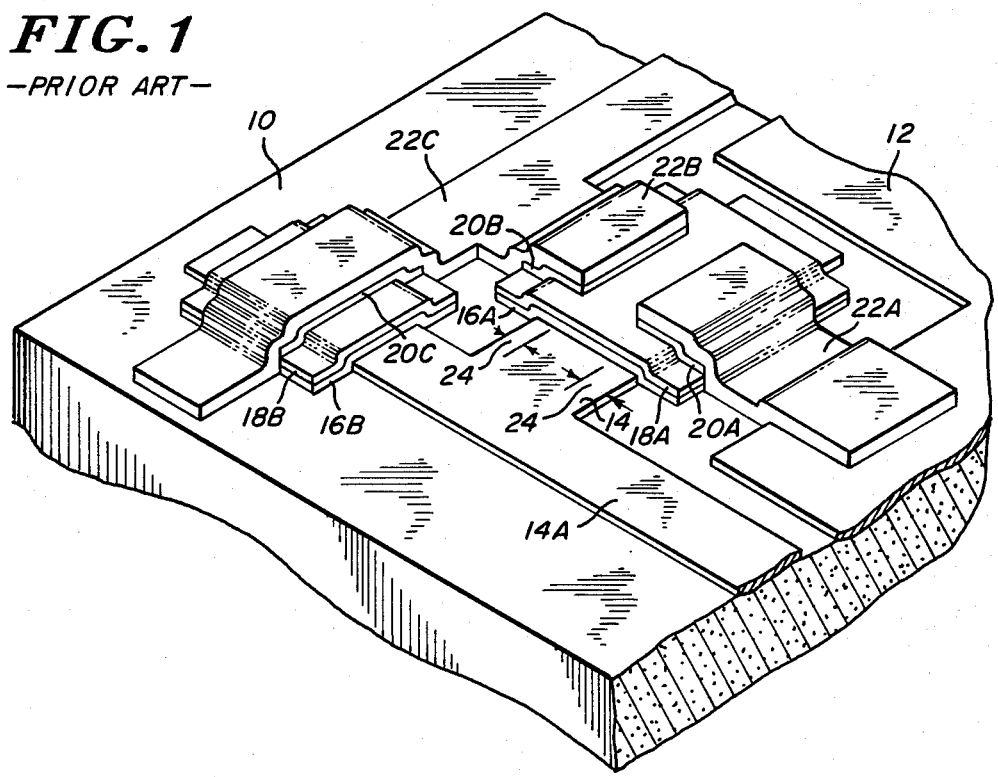
FIG. 1 is a perspective view of a prior art TFT structure as used in an array.

The prior art device which is illustrated in FIG. 1 will serve to demonstrate the disadvantages of the best previously known application of field-effect transistors to liquid crystal arrays, using lateral channel/gate transistors. On a glass substrate 10, a pixel element 12 of tin oxide (approx. 1000Å in thickness) has been formed by an atmospheric chemical vapor deposition process using SnCl4, oxygen and fluorine at 500° C. Photolithographical techniques are used to define the element 12 and the unwanted tin oxide is etched away, leaving space for transistors and the connecting grid. In the preferred embodiment of the invention, the pixel element 12 will have the extended portion seen in FIG. 2A and the transistor will be on that portion of the pixel. This extended portion is not essential to the design, however, as other positions of the transistor on the element 12 may be desirable in some applications.

A typical photoshaping process would include the application of a layer of a photoresist material, masking, curing the photoresist as by exposure to ultraviolet radiation, and removing the uncured material by etching. To initiate the etching step, the surface of the tin oxide would be covered by a zinc powder. The preferred etchant would be a diluted HCl solution. After etching, the remaining photoresist material is removed.

The gate region 14 of a metal such as nichrome or tantalum is created next, including a portion 14A which connects to a row of gates for addressing. This metal layer would be on the order of 1000–3000Å thick and would be shaped by the standard photolithographic process. Next, an insulator layer 16, an a-Si:H layer 18, and an a-n+Si:H layer 20 are deposited by a glow discharge technique. The preferred thicknesses of these layers would be 1000–1500Å 1000–3000Å and 300–600Å, respectively. Layer 16 is defined by the standard photolithographic processes to form a gate insulator region 16A of the transistor and an insulator region 16B of the crossover region. Layer 18 is simultaneously defined as a region 18A of the transistor and region 18B of the crossover. The a-n+Si:H layer 20 is first shaped along with layers 16,18, then shaped again as shown to form the regions 20A, 20B of the transistor and region 20C of the crossover. The preferred etching techniques are plasma or reactive ion etching. After the photoresist material has been removed, a second layer 22 of metal such as aluminum is deposited with a thickness of several thousand Angstroms. The layer 22 is photolithographically defined and etched to form region 22A, the transistor drain, region 22B, the transistor source, and region 22C which connects this source to the sources of a column of transistors and to the source voltage supply. The layer 20 is etched the second time after the metal layer 22 is etched. It is the masking step for layer 22 which is most critical. As shown at the reference 24, both the source and drain must overlap the gate region to assure the proper accumulation of electrons in the channel region when the gate voltage is applied. These overlaps are on the order of 0.5–3.0 μm. A misalignment of the source/drain mask which would create no overlap on one side of a transistor would render the transistor inoperative; i.e., it would not turn on.

This design also includes one critical processing step, the etching of the a-n+Si:H layer on top of the (essentially) intrinsic a-Si:H without having the benefit of etch selectivity or of an etch-stop between these two layers. The a-n+Si:H layer is needed to form ohmic contact between the source/drain metal and the intrinsic a-Si:H layer. To obtain the necessary high yield, the thickness and compositional uniformity of the a-n+Si:H layer, the uniformity of the etching process, and the etching time must be carefully controlled. Overetching at some portions of the substrate could cause complete removal of the a-n+Si:H and a-Si:H layers which would make some of the transistors permanently inoperative, while underetching of the a-n+Si:H layer could keep some of the transistors on all of the time, either condition being intolerable in a picture or data display.

Thus, it will be seen that at least five sequences of processing are necessary for depositing layers 12,14,16,18,20 and 22 of this prior art design, with one critical masking step and one critical processing step required. The array would be completed as is customary in LCD arrays; e.g., applying a passivating layer, adding spacers, mounting a back substrate, filling with liquid crystal, and sealing. Also to be noted is the amount of area on the substrate which is taken up by the combined transistor and crossover areas.

Figure 2A:
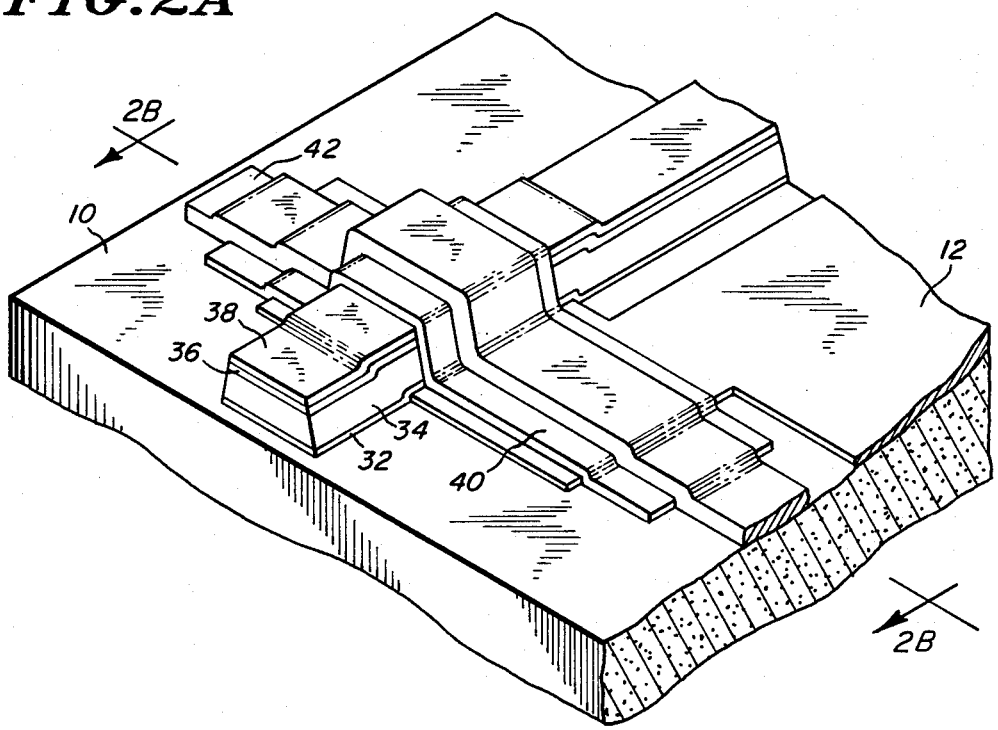
FIG. 2A is a perspective view of a vertical-channel TFT in accordance with the present invention.

In contrast, FIG. 2A shows a similar perspective view of an embodiment of the present invention with the substrate 10 and the pixel element 12 on one surface of the substrate. It is to be noted that, while glass is the customary material for such substrates, other materials may be used as well if they possess excellent transparency and insulating characteristics. While strength and rigidity are usually required, a flexible material may be desirable in some applications. FIG. 2B shows a cutaway view of the structure of FIG. 2A, and the two figures will be described together.

The use of a vertical gate thin film transistor (TFT) not only provides the speed necessary for a practical liquid crystal array but, since there are no critical masking and processing steps, can also provide the high yield which is required. The term "vertical gate transistor" is generally understood to mean a thin film transistor having source and drain layers non-coplanar but parallel to each other and to the substrate. The gate layer is formed over and around the other layers, but the actual channel is the micron or submicron vertical distance between the source and drain, along the side of the "sandwich". As is well known, the speed of operation of a TFT is proportional to the length of the channel.

The transistor itself takes up essentially the same amount of space as the crossover alone of FIG. 1. Wherever a source line and a gate line cross, two transistors are formed in parallel. In this way redundancy for the pixel transistor or a two-transistor circuit could be provided.

As described hereinabove, the 1000Å (approx.) transparent, conductive tin oxide layer 12 is deposited on the glass substrate 10 by the atmospheric chemical vapor deposition process. It is then photolithographically defined and etched by a diluted HCl solution. Then, four more layers are deposited over the entire substrate, a drain layer 32 of a-n+Si:H, a layer 34 of (essentially) intrinsic a-Si:H, the sidewall of which serves as the channel, another a-n+Si:H layer 36 and a metal layer 38 which will constitute the source. It should be noted that, while a-n+Si:H and a-Si:H are the preferred materials for the layers 32,36 and layer 34, respectively, other materials may also be used so long as such materials possess the requisite electrical characteristics. In some cases, alloys of semiconductor materials can be used; the amorphous nature of the semiconductor material can be modified; e.g., chlorine, fluorine or iodine could, individually or as mixtures, completely or partially replace the hydrogen to yield a-Si(halogen) with improved mobility, stability or interfacial properties between the amorphous silicon and the gate insulator. Preferably, the silicon layers are deposited using the glow discharge method, and the metal would be tantalum or tungsten, deposited by sputtering, e-beam evaporation or low pressure chemical vapor deposition. The layers 32 and 36 could also be formed of microcrystalline n+Si instead of a-n+Si:H. The thicknesses of the layers 32,34 and 36 would be on the order of 500-1500Å, 8000-15000Å, and 500-1500Å, respectively, while the metal would be 500-2000Å. The four layers, 32,34,36 and 38 are then defined photolithographically and etched into narrow lines, preferably using plasma etching or reactive ion etching techniques. Some of the suitable etching gases are $CF_4+O_2$, $CHF_3+O_2$, or $CF_3+Br_2$. Each narrow line extends through all of the transistors in one column of the array. Care must be taken with any of these etching processes to produce the desired etch profile and reproducibility.

Next the entire substrate is covered with a gate insulator layer 40 (1200-2000Å thick) such as silicon nitride, silicon dioxide or other similar insulators by the glow discharge process, and photolithographically defined and etched. The preferred etchant for silicon nitride would be boiling phosphoric acid or diluted HF; buffered HF may be used for silicon dioxide. Last, a 10,000Å layer 42 of metal such as aluminum is deposited by sputtering or e-beam evaporation and defined photolithographically, then etched into narrow lines, each of which provides the gates and gate connectors for all of the transistors in one row. The preferred etchant for the aluminum would be a phosphoric acidic acid solution.

FIG. 3 is a plan view of a section of a liquid crystal array showing the overall layout of the pixels and transistors. It should be noted that, although the pixels and their associated transistors are shown in perpendicular rows and columns, this is not essential to the invention. It is only necessary that the pixels are positioned in rows and columns which will allow addressing to be accomplished easily from the edges of the array with separate connections for each transistor.

As may be seen, the tin oxide layer 12 which forms an element of a pixel occupies a slightly larger proportion of the substrate than did the pixel of FIG. 1, while the transistor/crossover of the invention occupies less than half the corresponding areas of FIG. 1. The significance of the smaller area of transistor is that the smaller an area to be deposited, masked and etched, the less chance there is for pinholes or other processing errors. This fact alone increases the yield, particularly in a large array of transistors.

Running over the extended portion of the layer 12 is the source line 38 with layers 32,34,36 (FIG. 2) beneath, and extending to all of the transistors in a column. Over the central part of the extended portion of the layer 12 and over the source line 38 is the gate insulator layer 40. Running over the insulator layer 40 and extending to all of the transistors in a row is the gate layer 42. This figure, like the others, is not drawn to scale, but the lines 38 and 42 might be in the range of 2 to 40 μm wide and the main area of pixel element 12 might be 200 to 500 μm wide.

Since it is important to minimize the leakage between the layers 32,34,36, it is necessary to carefully control the doping level of the intrinsic layer 34. Minimization of the device area is also a factor in reducing leakage. However, a structural improvement is illustrated in FIG. 4 where, instead of the a-n+Si:H/a-Si:H/ a-n+Si:H/metal "sandwich" shown in FIGS. 2A and 2B, the layers are the a-n+Si:H layer 32, a true insulator layer 50, the a-n+Si:H layer 36, and the metal source layer 38. The insulator 50 could be $SiO_2$, $Si_3N_4$, $Ta_2O_5$ or $Al_2O_3$, for example. The thicknesses of the layers are essentially the same as those given for FIGS. 2A,2B. Dry chemical etching techniques are used in this instance.

Subsequently, an a-Si:H layer 52 and the gate insulator layer 40 are applied and photolithographically processed as before. The gate metal 42 is then applied and shaped as before. Care should be taken in the etching processes not to leave discontinuities at the a-n+Si:H-/insulator borders of layers 32,50,36, so that the layers 40,42,52 can be formed smoothly.

Figure 5:
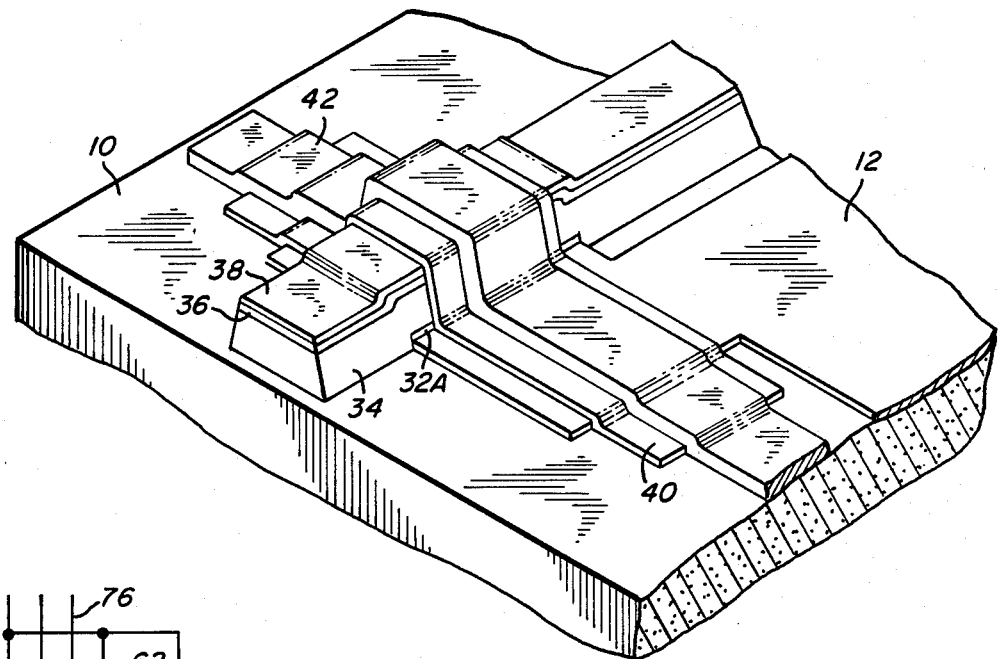
FIG. 5 is a perspective view of still another embodiment.

In order to minimize the possibility of drain leakage current through a pinhole in the a-Si:H layer 34 (FIG. 2) or the insulator layer 50 (FIG. 4), allowing the source metal 38 to contact the a-n+Si:H drain region 32, a modification in the process can be made, as seen in FIG. 5. FIG. 5 corresponds to FIG. 2A with one change, and this change is equally applicable to FIG. 4. Instead of depositing and forming the drain region 32 along with the layers 34,36,38 (or layers 50,36,38 of FIG. 4) as described hereinabove, a drain region 32A is formed by deposition of a layer of a-n+Si:H or microcrystalline n+Si material on the deposited tin oxide layer. The tin oxide and silicon material are then defined and etched to form pixel element 12 with a-n+Si:H material covering the element. In subsequent etching, the a-n+Si:H material is removed except for that portion under the source line, forming the transistor drain. This etching step is preferably combined with the etching of the layers 34,36,38 (or layers 50,36,38). The remainder of the processing is as described hereinabove with reference to FIG. 2 (or FIG. 4).

Figure 6:
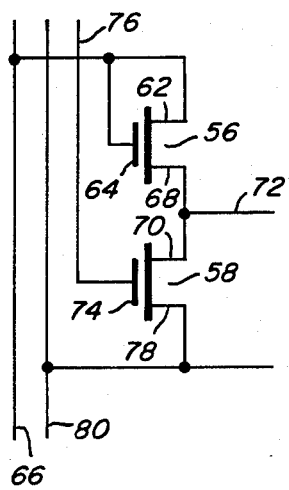
FIG. 6 is a schematic of an extended application of the invention.

In FIG. 6, a schematic of an inverter circuit is shown, consisting of a load transistor 56 and a pull-down transistor 58. This inverter circuit is designed to be fabricated on the same substrate by the same processing steps used for the TFT switching circuitry and pixel elements described with respect to FIGS. 2-5. Therefore, the materials and thicknesses of the layers will be as described hereinabove. It will be apparent to those skilled in the art that, with minimal adaptation, the invention can be utilized to provide any driver circuit consisting of elements such as shift registers, buffer drivers, etc. The more elements which can be integrated into the same display array, and processed at the same time, the fewer wire bonds or other types of interconnections will be required. The yield will therefore be increased accordingly, and the cost lowered.

In the circuit of FIG. 6, the drain 62 and gate 64 of the load transistor 56 are connected to a $V_{DD}$ supply voltage terminal 66. The source 68 of the transistor 56 and the drain 70 of the transistor 58 are connected together and to an output terminal 72. The gate 74 of the transistor 58 is connected to an input terminal 76, and the source 78 of the transistor 58 is connected to a ground or reference terminal 80.

Figure 7:
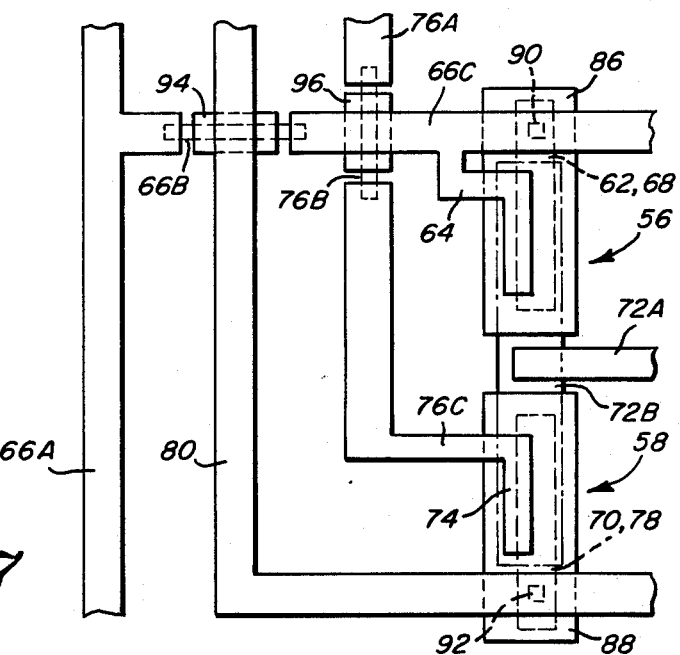
FIG. 7 is a plan view illustrating the application of FIG. 6.

In FIG. 7 may be seen the plan view of the circuit of FIG. 6 as it could be constructed on the substrate 10 of the previous figures. Reference will be made specifically to the structure of FIGS. 2A,2B, but it will be apparent that this extension of the invention is equally applicable to the embodiments of FIGS. 4 and 5. At the same time that the tin oxide layer 12 which forms one element of a pixel is deposited, defined and etched, three connecting links 66B,76B,72B are formed. Link 66B is seen to be a "crossunder" which connects portions 66A and 66C, forming the VDD line 66. Link 76B is another crossunder which connects portions 76A and 76C, forming the input line 76. The link 72B is the region of tin oxide which underlies the transistors and couples source 68 to drain 70 and to the output terminal 72A.

Next, the a-n+Si:H/a-Si:H/a-n+Si:H/metal layers are applied as described with respect to FIGS. 2A,2B. These four layers form the source and drain of each of the transistors 56,58 with an intrinsic a-Si:H (or insulator) layer between, the sidewalls of which comprise the channels. The source and drain are interchangeable in a thin-film transistor, and in the case of transistor 56, the bottom a-n+Si:H layer is the source 68 while in the transistor 58, the bottom layer is the drain 70. Standard photolithographical techniques are used to define and etch the four layers to form regions 62/68 and 70/78.

At the same time that the gate insulator 40 is formed, two gate insulators 86,88 for the transistors 56,58 respectively are also formed. Two windows 90,92 are formed in the insulators 86,88 in order that the voltage supply line portion 66C can contact the drain 62 and that the ground line 80 can contact the source 78. Also formed in this same step are two insulator portions, 94,96 which insulate the two crossunder areas in the lines 66 and 76. This processing step is the same one that forms the gate insulator layer 40 of FIG. 2. In the embodiments of FIG. 4, the portions 94,96 would consist of two layers, a-Si:H and insulator.

A metal layer is then deposited and a number or interconnects are formed as well as the gate region 42 (FIG. 2). The interconnects include the two portions 66A,66C of the voltage supply line and the gate region 64, the ground line 80, the input line portions 76A,76C, and the gate region 74, and the output line portion 72A. In order to minimize the parasitic capacitances, the gate regions 64,74 preferably extend over only one side wall rather than both as in FIG. 2. The layout illustrated in FIG. 7 is applicable to any of the processing sequences described hereinabove, but is not to be construed as limiting the invention.

Thus there has been shown and described means for integrating vertical gate thin film transistors into liquid crystal arrays. The transistors created at the connection line crossovers can be utilized for addressing the pixels, and similar transistors, fabricated at the same time by same processing steps, can also function as other elements of the display circuitry, such as shift registers, buffer drivers, inverters, etc. The speed of operation of all such elements is increased by many times due to the shortened channel length which is available in vertical gate TFTs. The minimization of critical processing steps also increases the yield of the arrays which must be essentially 100% to be usable. Other variations and modifications will be apparent to those skilled in the art, and it is intended to cover all such as fall within the scope of the appended claims.

What is claimed is:

1. A method of producing an integrated array of liquid crystal pixels and vertical gate thin film transistors for charging said pixels and comprising the steps of:
   providing an insulating substrate at least as large as the desired array;
   forming on said substrate a first layer of a transparent conductive material and a second layer of a semiconducting material;
   defining and etching said first and second layers to form one element of each said liquid crystal pixel with an overlay of semiconducting material, said pixel elements being arranged in a plurality of rows and columns;
   forming over said substrate and said previously formed elements a third layer, a fourth layer of a semiconducting material, and a fifth layer of a conducting material;
   defining and etching said second, third, fourth and fifth layers to provide on each said pixel element a first element for each said transistor formed from said second layer, and a first set of narrow lines from said third, fourth and fifth layers, each said narrow line traversing a column of said first transistor elements, each portion of said fifth layer subjacent one of said first transistor elements providing a second transistor element;
   forming over said substrate and said previously formed elements a sixth layer of at least an insulating material;
   defining and etching said sixth layer to form insulating areas, each area traversing one of said second transistor elements;
   forming over said substrate and said previously formed elements a seventh layer of a conductive material insulated from said previously formed elements by said insulating area;
   defining and etching said seventh layer to form a second set of narrow lines, each said line traversing a row of said second transistor elements, each portion of said second set of narrow lines adjacent the edges of a set of first and second transistor elements forming a third element of the respective transistor, and wherein each said pixel element has an extended portion and said transistor elements are positioned one the respective extended portions.

2. The method according to claim 1 wherein said third layer is formed of an insulating material and said sixth layer includes a layer of semiconducting material under said insulating material.

3. The method according to claim 1 wherein said third layer is formed of a semiconducting material.

4. The method according to claim 1 wherein the insulating substrate is formed of glass.

5. The method according to claim 1 wherein the first layer of conductive material is formed by means of chemical vapor deposition.

6. The method according to claim 1 wherein said first layer of conductive material formed on the substrate is of tin oxide.

7. The method according to claim 1 wherein said tin oxide layer is formed by deposition from a chemical vapor including at least $SnCl_4$, $O_2$ and $F_2$.

8. The method according to claim 1 wherein the steps of defining elements include the steps of;
   covering a layer of material with a photoresist material;
   providing a mask covering desired portions of said photoresist material;
   exposing said masked material to appropriate radiation for curing said photoresist material; and
   removing the undesired portions of said photoresist material.

9. The method according to claim 1 wherein the step of etching the first layer of conductive material is preceded by a step of coating said first layer with powdered zinc.

10. The method according to claim 1 wherein each said first transistor element is the drain of a thin film transistor.

11. The method according to claim 1 wherein said second and fourth layers of a semiconducting material are comprised of a-n+Si:H material, deposited by a glow discharge process.

12. The method according to claim 1 wherein said fifth layer of a conducting material is comprised of a metal, deposited by sputtering.

13. The method according to claim 1 wherein said fifth layer of a conducting material is comprised of a metal, deposited by electron beam evaporation.

14. The method according to claim 1 wherein said second and fourth layers of a semiconducting material are comprised of a microcrystalline n+Si material, deposited by a glow discharge process.

15. The method according to claim 1 wherein said sixth layer is composed of one of a group of insulators consisting of silicon nitride, silicon dioxide, tantalum oxide and aluminum oxide.

16. The method according to claim 1 wherein said seventh layer is composed of Al.

17. The method according to claim 1 wherein each said second transistor element is the source of a thin film transistor.

18. The method according to claim 1 wherein each said third transistor element is the gate of a thin film transistor.

19. A method of producing an integrated array of liquid crystal pixels and vertical gate thin film transistors for charging said pixels and comprising the steps of:
providing an insulating substrate at least as large as the desired array;
forming on said substrate a first layer of a transparent conductive material and a second layer of a semiconducting material;
defining and etching said first and second layers to form one element of each said liquid crystal pixel with an overlay of semiconducting material, said pixel elements being arranged in a plurality of rows an columns;
forming over said substrate and said previously formed elements a third layer, a fourth layer of a semiconducting material, and a fifth layer of a conducting material, said fifth layer being composed of one of the group consisting of tungsten, tantalum and nichrome;
defining and etching said second, third, fourth and fifth layers to provide on each said pixel element a first element for each said transistor formed from said second layer, and a first set of narrow lines from said third, fourth and fifth layers, each said narrow line traversing a column of said first transistor elements, each port ion of said fifth layer superjacent one of said first transistor elements providing a second transistor element;
forming over said substrate and said previously formed elements a sixth layer of an least an insulating material;
defining and etching said sixth layer to form insulating area, each area traversing one of said second transistor elements;
forming over said substrate and said previously formed elements a seventh layer of a conductive material insulated from said previously formed elements by said insulating area; and
defining and etching said seventh layer to form a second set of narrow lines, each said line traversing a row of said second transistor elements, each portion of said second set of narrow lines adjacent the edges of a set of first and second transistor elements forming a third element of the respective transistor.

20. A method of producing an integrated array of liquid crystal pixels and vertical gate thin film transistors for charging said pixels and comprising the steps of:
providing an insulating substrate at least as large as the desired array;
forming on said substrate one element of each said liquid crystal pixel, said pixel elements being comprised of a transparent, conductive material and arranged in a plurality of rows and columns;
forming on said substrate, and over a part of each said pixel element, a first element of one of said transistors;
forming on said substrate, and over and insulated from each said first transistor element, a second transistor element, the second transistor elements on one row of said pixel elements being coupled together; and
forming on said substrate, adjacent edges of and insulated from each set of said first and second transistor elements, a third transistor element, the third transistor elements on one column of said pixel elements being coupled together;
wherein said array further includes peripheral circuitry including additional integrated vertical gate thin film transistors and
wherein the steps of forming an element of each of said pixels further includes simultaneously forming crossunder areas for connecting portions of said circuitry.

21. A method of producing an integrated array of liquid crystal pixels and vertical gate thin film transistors for charging said pixels and comprising the steps of:
providing an insulating substrate at least as large as the desired array;
forming on said substrate one element of each said liquid crystal pixel, said pixel elements being comprised of a transparent, conductive material and arranged in a plurality of rows and columns;
forming on said substrate, and over a part of each said pixel element, a first element of one of said transistors;
forming on said substrate, and over and insulated from each said first transistor element, a second transistor element, the second transistor elements on one row of said pixel elements being coupled together; and
forming on said substrate, adjacent edges of and insulated from each set of said first and second transistor elements, a third transistor element, the third transistor elements on one column of said pixel elements being coupled together;
wherein said array further includes peripheral circuitry including additional integrated vertical gate thin film transistors and
wherein the steps of forming an element of each of said pixels further includes simultaneously forming interconnecting portions of said circuitry.

22. A method of producing an integrated array of liquid crystal pixels and vertical gate thin film transistors for charging said pixels and comprising the steps of:
providing an insulating substrate at least as large as the desired array;
forming on said substrate one element of each said liquid crystal pixel, said pixel elements being comprised of a transparent, conductive material and arranged in a plurality of rows and columns;

forming on said substrate, and over a part of each said pixel element, a first element of one of said transistors;

forming on said substrate, and over and insulated from each said first transistor element, a second transistor element, the second transistor elements on one row of said pixel elements being coupled together; and forming on said substrate, adjacent edges of and insulated from each set of said first and second transistor elements, a third transistor element, the third transistor elements on one column of said pixel elements being coupled together;

wherein said array further includes peripheral circuitry including additional integrated vertical gate thin film transistors and wherein the steps of forming said first and second elements of said charging transistors further includes simultaneously forming at least two elements of said additional thin film transistors.

23. A method of producing an integrated array of liquid crystal pixels and vertical gate thin film transistors for charging said pixels and comprising the steps of:

providing an insulating substrate at least as large as the desired array;

forming on said substrate one element of each said liquid crystal pixel, said pixel elements being comprised of a transparent, conductive material and arranged in a plurality of rows and columns;

forming on said substrate, and over a part of each said pixel element, a first element of one of said transistors;

forming on said substrate, and over and insulated from each said first transistor element, a second transistor element, the second transistor elements on one row of said pixel elements being coupled together; and forming on said substrate, adjacent edges of and insulated from each set of said first and second transistor elements, a third transistor element, the third transistor elements on one column of said pixel elements being coupled together;

wherein said array further includes peripheral circuitry including additional integrated vertical gate thin film transistors and wherein the steps of forming said third elements of said charging transistors further includes simultaneously forming at least one element of each of the transistors of the peripheral circuitry.

24. A method of producing an integrated array of liquid crystal pixels and vertical gate thin film transistors for charging said pixels and comprising the steps of:

providing an insulating substrate at least as large as the desired array;

forming on said substrate one element of each said liquid crystal pixel, said pixel elements being comprised of a transparent, conductive material and arranged in a plurality of rows and columns;

forming on said substrate, and over a part of each said pixel element, a first element of one of said transistors;

forming on said substrate, and over and insulated from each said first transistor element, a second transistor element, the second transistor elements on one row of said pixel elements being coupled together; and forming of said substrate, adjacent edges of and insulated from each set of said first and second transistor elements, a third transistor element, the third transistor elements on one column of said pixel elements being coupled together;

wherein said array further includes peripheral circuitry including additional integrated vertical gate thin film transistors and wherein the steps of forming said third elements of said charging transistors further includes simultaneously forming portions of interconnecting lines for the peripheral circuitry.

25. A method of producing an integrated array of liquid crystal pixels and vertical gate thin film transistors for charging said pixels and comprising the steps of:

providing an insulating substrate at least as large as the desired array;

forming on said substrate one element of each said liquid crystal pixel, said pixel elements being comprised of a transparent, conductive material and arranged in a plurality of rows and columns;

forming on said substrate, and over a part of each said pixel element, a first element of one of said transistors;

forming on said substrate, and over and insulated from each said first transistor element, a second transistor element, the second transistor elements on one row of said pixel element being coupled together; and forming on said substrate, adjacent edges of and insulated from each set of said first and second transistor elements, a third transistor element, the third transistor elements on one column of said pixel elements being coupled together;

wherein said array further includes peripheral circuitry including additional integrated vertical gate thin film transistors and wherein the step of forming and insulating said second and third elements of said charging transistors further includes simultaneously forming insulating areas over at least the first and second elements of said additional transistors.

* * * * *